United States Patent
Nagai

[11] Patent Number: 5,880,501
[45] Date of Patent: Mar. 9, 1999

[54] SEMICONDUCTOR INTEGRATED CIRCUIT AND MANUFACTURING METHOD OF THE SAME

[75] Inventor: Takayuki Nagai, Tokyo, Japan

[73] Assignee: NEC Corporation, Tokyo, Japan

[21] Appl. No.: 805,463

[22] Filed: Feb. 26, 1997

[51] Int. Cl.$^6$ .................................................... H01L 23/62
[52] U.S. Cl. ............................................ 257/355; 257/356
[58] Field of Search ....................................... 257/355, 356

[56] References Cited

FOREIGN PATENT DOCUMENTS 8-316421  11/1996  Japan .

*Primary Examiner*—Mark V. Prenty

[57] ABSTRACT

A dual diffusion layer composed of an n$^-$ type diffusion layer 5 and an n$^+$ type diffusion layer 6 is formed in a first element forming region element-separated by a field oxidized film 2, a p$^+$ type diffusion layer 7 is formed in a second element forming region, a p type guard ring layer 3 provided below the field oxidized film 2 and the cathode n$^+$ type diffusion layer 6 are placed adjacent to each other, and thus reach-through breakdown voltage is made lower than that of an internal transistor.

11 Claims, 5 Drawing Sheets

SEMICONDUCTOR INTEGRATED CIRCUIT AND MANUFACTURING METHOD OF THE SAME

BACKGROUND OF THE INVENTION

The present invention relates to a semiconductor integrated circuit device, and more particularly to a protective circuit element.

FIG. 3 is a section view of a semiconductor chip, showing one example of a conventional protective off-buffer element. Referring to FIG. 3, a high voltage system (power supply voltage of 10 V or higher) is composed of a field oxidized film 2 which is provided in the surface of a P type silicon substrate 1 for plotting an element forming region, a p type guard ring layer 3 which is provided below the field oxidized film 2, a gate oxidized film 4 which is formed in the surface of the element forming region, a gate electrode 11 which is selectively formed on the gate oxidized film 4, source and drain regions each having a dual diffusion layer structure, which is composed of a deep $n^-$ type diffusion layer 6 formed by implanting impure ions in the element forming region with this gate electrode 11 and the field oxidized film 2 as masks and a shallow $n^+$ type diffusion layer 7 provided inside the $n^-$ type diffusion layer 6, a layer insulating film 8 which is provided in a surface including the gate electrode 11, and drain and source electrodes 12 and 13 which are formed by being connected to the $n^+$ type diffusion layer 6 of a contact hole provided in the layer insulating film 8.

This configuration is the same as that of a logic circuit high voltage system MOS transistor, and as shown in the equivalent circuit of FIG. 4, this high voltage system is used as an off-buffer by keeping the gate electrode at the same potential as that of the substrate.

If this off-buffer is used as a protective element, the sequence of its operational steps is as follows.

(1) A high voltage pulse is impressed to the drain electrode.

(2) A breakdown occurs in the junction diode D of the drain diffusion layer.

(3) A hole created as an electron and hole pair raises a potential under the gate electrode.

(4) A parasitic npn type bipolar transistor B is switched ON, and thereby resistance after the breakdown can be reduced.

In this case, a current flows through drain and source resistors $R_D$ and $R_S$, and thus heat generating phenomena occur in the drain and source resistors $R_D$ and $R_S$ There were problems inherent in this conventional semiconductor integrated circuit device. More particularly, since the structure of the protective circuit element was the same as that of the internal logic circuit, its breakdown voltage was also the same. Furthermore, when the densities of the $n^-$ type diffusion layers of the drain and source regions were low and drain resistance and source resistance were high, switching-ON of the parasitic npn type bipolar transistor caused an overcurrent to flow, and heating of the drain and source regions brought about junction destruction.

Accordingly, when the off-buffer was to be used as a protective element, it was necessary to disperse a current by increasing its occupancy area.

SUMMARY OF THE INVENTION

The present invention was made with a view to solving the foregoing problems.

A purpose of the present invention is to provide a semiconductor integrated circuit, which has a protective element having breakdown voltage lower than that of an internal circuit element.

The purpose of the present invention is achieved by a semiconductor integrated circuit, which comprises a field insulating film formed in the main surface of a conductive semiconductor substrate for element-separating each of first and second element forming regions, a conductive guard ring layer formed below the field insulating film, a dual diffusion layer composed of an opposite-conductive deep low impurity concentration diffusion layer formed in the semiconductor substrate of the first element forming region and a shallow high impurity concentration diffusion layer formed in the upper part of the low impurity concentration diffusion layer in an adjacent relation to the guard ring layer, and a conductive high impurity concentration diffusion layer formed in the semiconductor substrate of the second element forming region.

The purpose of the present invention is also achieved by a manufacturing method of a semiconductor integrated circuit, which includes the steps of forming a field oxidized film by locally oxidizing one surface of a conductive semiconductor substrate, forming a guard ring layer below the field oxidized film, forming gate oxidized films in the first and second element forming regions of the conductive semiconductor substrate surface, in which no field oxidized films are formed, forming a dual diffusion layer by forming an opposite-conductive deep low impurity concentration diffusion layer in the conductive semiconductor substrate of the first element forming region and a high impurity concentration diffusion layer in the upper part of the low impurity concentration diffusion layer in an adjacent relation to the guard ring, forming a conductive high impurity concentration diffusion layer in the semiconductor substrate of the second element forming region, forming layer insulating films on the field oxidized film and the gate oxidized films, forming holes on the dual diffusion layer of the first element forming region and the high impurity concentration diffusion layer of the second element forming region, and forming electrodes for the first and second elements in the holes.

According to the present invention, the low impurity concentration opposite-conductive diffusion layer is formed in the first element forming region, which is plotted by the field oxidized film on the surface of the conductive semiconductor substrate, and the high impurity concentration opposite-conductive diffusion layer is formed in the upper part thereof in an adjacent relation to one conductive guard ring layer, which is formed below the field oxidized film. Thus, the spread of a depletion layer when a high voltage pulse is impressed to a cathode electrode is smaller than that when the high impurity concentration opposite-conductive layer and one conductive guard ring layer are away from each other in the internal transistor. As a result, a protective element having reach-through breakdown voltage lower than that of the internal transistor can be provided.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

The present invention will now be described with reference to the accompanying drawings.

Figure 1:
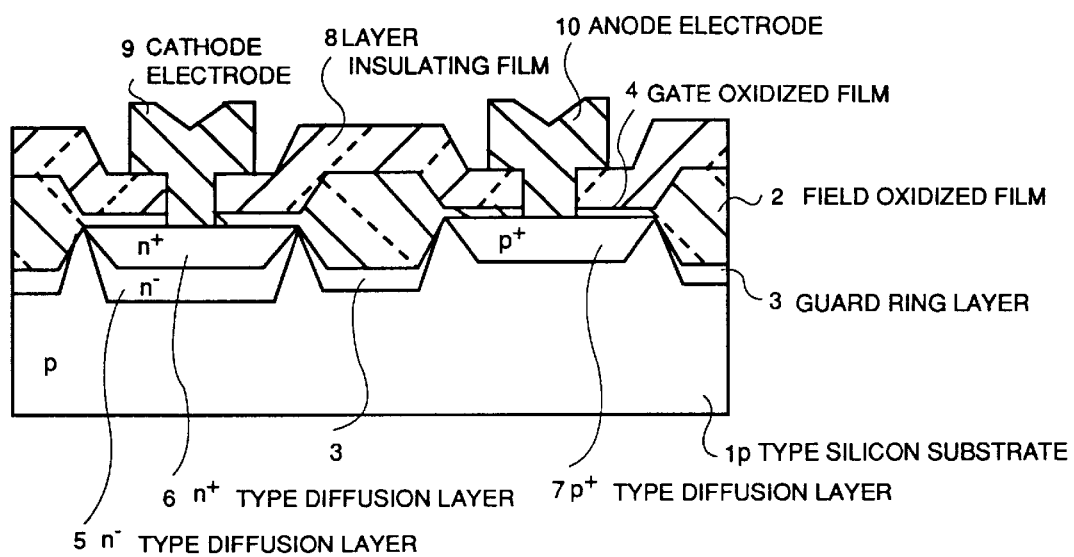
FIG. 1 is a section view of a semiconductor chip, showing an embodiment of the present invention.

FIG. 1 is a section view of a semiconductor chip, showing an embodiment of the present invention, and FIGS. 2A to 2G are views, showing steps in a manufacturing process of the semiconductor chip.

Figure 2A:
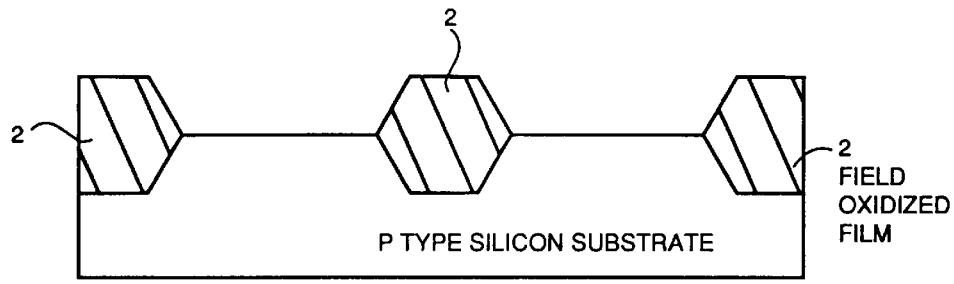
FIGS. 2A to 2G are views, each showing a step in a manufacturing process of the semiconductor chip of the present invention.
Figure 2B:
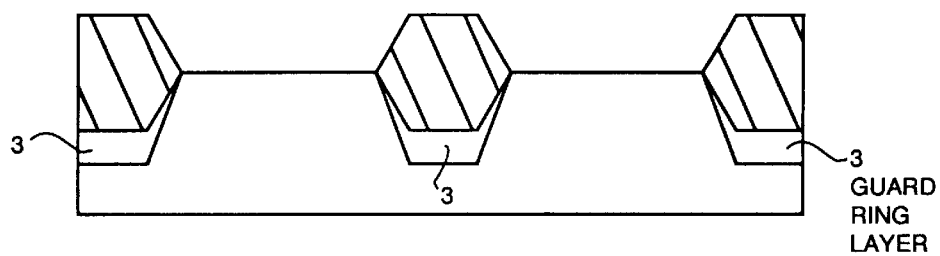
Figure 2C:
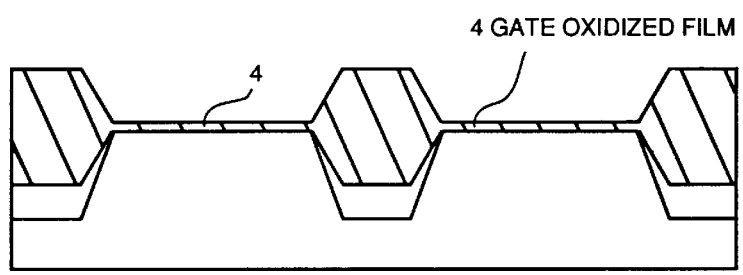
Figure 2D:
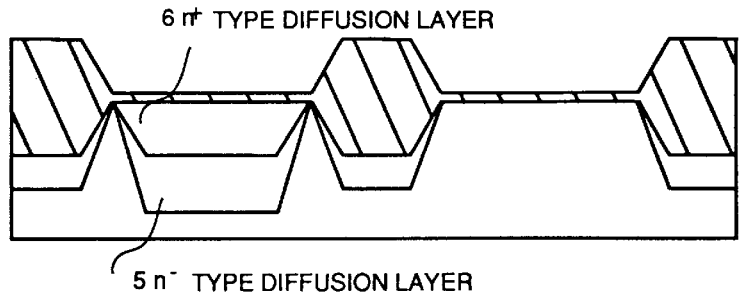

Referring to FIG. 1 and FIGS. 2A to 2G, first, below a field oxidized film 2 which is formed by locally oxidizing the surface of a P type silicon substrate having impurity concentration of $1 \times 10^{14}$ to $1 \times 10^{16}$ atom/cm$^3$ (FIG. 2A), a p type guard ring 3 having impurity concentration of $1 \times 10^{16}$ to $1 \times 10^{19}$ atom/cm$^3$ and a depth of 0.2 to 1 $\mu$m is formed (FIG. 2B). Then, gate oxidized films 4 each having a thickness of 40 to 100 nm are formed on the surfaces of first and second element forming regions plotted by the field oxidized film 2 and placed adjacent to each other (FIG. 2C). A dual diffusion layer is formed, the layer being composed of an n$^-$ type diffusion layer 5 having impurity concentration of $1 \times 10^{16}$ to $1 \times 10^{19}$ atom/cm$^3$ and a depth of 0.3 $\mu$m to 2 $\mu$m, which is formed in the first element forming region, and an n$^+$ type diffusion layer 6 having impurity concentration of $1 \times 10^{19}$ to $1 \times 10^{22}$ atom/cm$^3$ and a depth of 0.1 to 0.5 $\mu$m, which is formed on the n$^-$ type diffusion layer 5 (FIG. 2D).

Figure 2E:
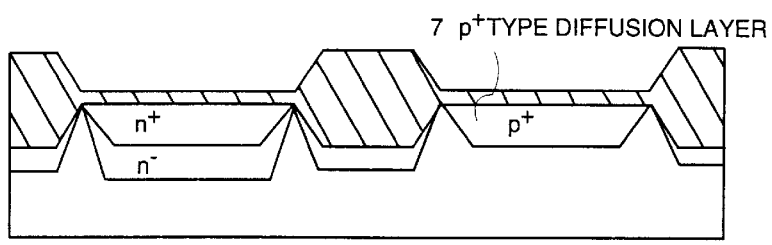
Figure 2F:
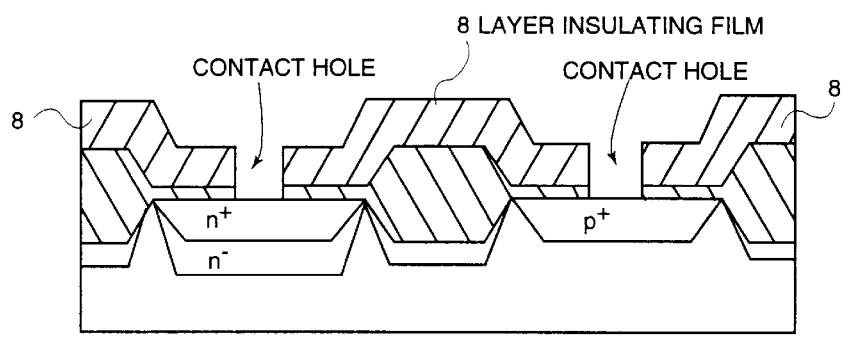
Figure 2G:
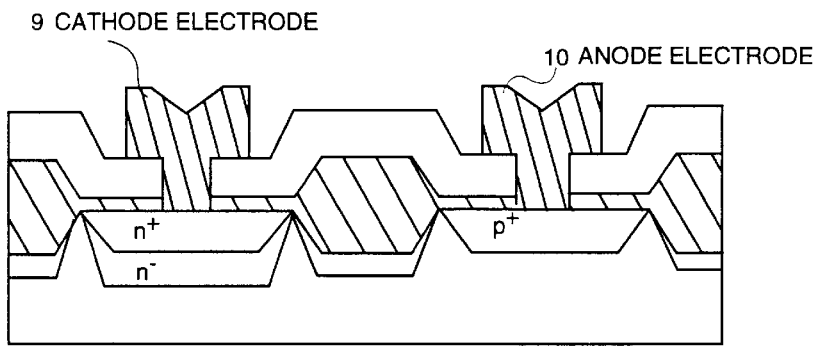
Figure 3:
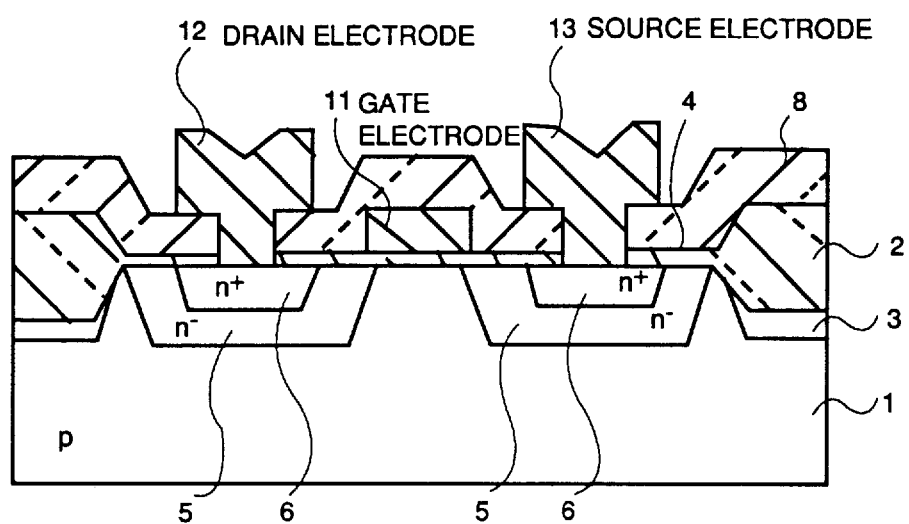
FIG. 3 is a section view of a semiconductor chip of a conventional semiconductor integrated circuit.
Figure 4:
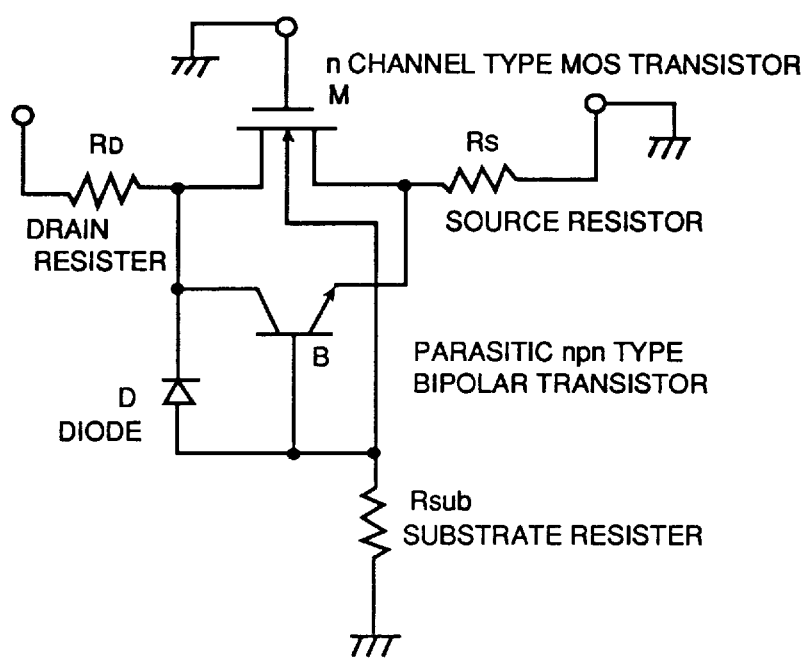
FIG. 4 is a view showing an equivalent circuit of FIG. 3.

Thereafter, a p$^+$ type diffusion layer 7 having impurity concentration of $1 \times 10^{19}$ to $1 \times 10^{22}$ atom/cm$^3$ and a depth of 0.2 to 1 $\mu$m is formed in the second element forming region (FIG. 2E). Then, a layer insulating film 8 is deposited on the full surface and selectively etched, and contact holes are formed on the n$^+$ type diffusion layer 6 and the p$^+$ type diffusion layer 7 (FIG. 2F). A metallic film is then deposited on a surface including these contact holes and patterned, and a cathode electrode 9 connected to the n$^+$ type diffusion layer 6 of the contact hole and an anode electrode 10 connected to the p$^+$ type diffusion layer 7 are respectively formed (FIG. 2G).

Although not shown, the cathode electrode 9 is connected to an external terminal and the gate electrode of a transistor to be protected (when a protective element is used for input protection) or the drain of the protected transistor (when the protective element is used for output protection).

In the semiconductor integrated circuit thus constructed, since the n$^+$ type diffusion layer 6 is placed adjacent to the p type guard ring layer 3, the extension of a depletion layer is limited and reach-through breakdown voltage is lower than that of the internal transistor. Therefore, a protective diode having breakdown voltage lower than that of the internal transistor can be formed without adding any special process or step. Moreover, since a current flows without passing through the n$^-$ type diffusion layer 5, heat generation is restrained and thereby junction destruction is prevented.

As apparent from the foregoing description, according to the present invention, by the low impurity concentration opposite-conductive diffusion layer, which is formed in the first element forming region plotted by the field oxidized film on the surface of one conductive semiconductor substrate, and the high impurity concentration opposite-conductive diffusion layer, which is formed in the upper part thereof and below the field oxidized film in an adjacent relation to one conductive guard ring layer, the spread of the depletion layer when a high voltage pulse is impressed to the cathode electrode is caused to be smaller than that when the high impurity concentration opposite-conductive diffusion layer and the conductive guard ring layer are away from each other in the internal transistor, and thus the protective element having reach-through breakdown voltage lower than that of the internal transistor can be provided. In practice, when the n$^+$ type diffusion layer has impurity concentration of $1 \times 10^{16}$ to $1 \times 10^{19}$ atom/cm$^3$ and a depth of 0.3 to 2 $\mu$m and the p type guard ring layer has impurity concentration of $1 \times 10^{16}$ to $1 \times 10^{19}$ atom/cm$^3$ and a depth of 0.2 to 1 $\mu$m, the breakdown voltage of the protective diode of the present invention is 2 to 30 V while the breakdown voltage of the internal transistor is 20 to 80 V.

These diffusion layers can all be formed in self-alignment, and thus it is possible to form these layers by the same steps as those for the internal transistor without adding any special steps.

In addition, the gate electrode necessary for the conventional MOS type protective element can be omitted and the protective element can be formed in a smaller occupancy area. Also, breakdown voltage lower than that of the internal transistor prevents an overcurrent from flowing to the internal transistor. Accordingly, unlike the conventional case, it is not necessary to disperse an overcurrent in a large area, and this makes it possible to form the protective element in a smaller occupancy area.

Furthermore, since an overcurrent flows through the high impurity concentration diffusion layer to the p type guard ring layer, this does not pass through the low impurity concentration n type diffusion layer. This makes it possible to restrain heat generation and prevent junction destruction.

The entire disclosure of Japanese Patent Application No. 7-124881 filed on May 24, 1995 including specification, claims, drawing and summary are incorporated herein by reference in its entirety.

What is claimed is:

1. A semiconductor integrated circuit comprising:
   a field insulating film, which is formed in a main surface of a first conductive type semiconductor substrate for element-separating each of first and second element forming regions;
   a conductive guard ring layer, which is formed below said field insulating film,
   a dual diffusion layer composed of a second conductive type deep low impurity concentration diffusion layer formed in said semiconductor substrate of said first element forming region and a second conductive type shallow high impurity concentration diffusion layer formed in an upper part of said low impurity concentration diffusion layer in an adjacent relation to said guard ring layer; and
   a first conductive type high impurity concentration diffusion layer formed in said semiconductor substrate of said second element forming region.

2. The semiconductor integrated circuit as claimed in claim 1, wherein said conductive semiconductor substrate is composed of a P type silicon substrate having impurity concentration set to one within a range of $1 \times 10^{14}$ to $1 \times 10^{16}$ atom/cm$^3$.

3. The semiconductor integrated circuit as claimed in claim 1, wherein said guard ring layer is a p type guard ring layer having impurity concentration set to one within a range of $1 \times 10^{14}$ to $1 \times 10^{16}$ atom/cm$^3$ and a depth set to one within a range of 0.2 to 1 $\mu$m.

4. The semiconductor integrated circuit as claimed in claim 1, wherein said low impurity concentration diffusion layer is an n⁻ type diffusion layer having impurity concentration set to one within a range of $1\times10^{16}$ to $1\times10^{19}$ atom/cm³ and a depth set to one within a range of 0.3 to 2 μm, and said high impurity concentration diffusion layer is an n⁺ type diffusion layer having impurity concentration set to one within a range of $1\times10^{19}$ to $1\times10^{22}$ atom/cm³ and a depth set to one within a range of 0.1 to 0.5 μm.

5. The semiconductor integrated circuit as claimed in claim 1, wherein said conductive high impurity concentration diffusion layer is a p⁺ type diffusion layer having impurity concentration set to one within a range of $1\times10^{19}$ to $1\times10^{22}$ atom/cm³ and a depth set to one within a range of 0.2 to 1 μm.

6. A diode comprising:

a P type silicon substrate;

a field oxidized film, which is formed in a main surface of said P type silicon substrate for element-separating each of cathode and anode forming regions;

gate oxidized films, which are formed in said cathode and anode forming regions;

a dual diffusion layer, which is composed of a deep n⁻ type diffusion layer formed in said P type silicon substrate of said cathode forming region, and a shallow n⁺ type diffusion layer formed in an upper part of said n⁻ type diffusion layer;

a p type guard ring layer, which is formed below said field oxidized film in an adjacent relation to said n⁺ type diffusion layer;

a p⁺ type diffusion layer, which is formed in said P type silicon substrate of said anode forming region;

a cathode electrode, which is formed in said cathode forming region; and an anode electrode, which is formed in said anode forming region.

7. The diode as claimed in claim 6, wherein said P type silicon substrate has impurity concentration set to one within a range of $1\times10^{14}$ to $1\times10^{16}$ atom/cm³.

8. The diode as claimed in claim 6, wherein each of said gate oxidized films has a-thickness set to one within a range of 40 to 100 nm.

9. The diode as claimed in claim 6, wherein said p type guard ring layer has impurity concentration set to one within a range of $1\times10^{14}$ to $1\times10^{16}$ atom/cm³ and a depth set to one within a range of 0.2 to 1 μm.

10. The diode as claimed in claim 6, wherein said n⁻ type diffusion layer has impurity concentration set to one within a range of $1\times10^{16}$ to $1\times10^{19}$ atom/cm³ and a depth set to one within a range of 0.3 to 2 μm, and said n⁺ type diffusion layer has impurity concentration set to one within a range of $1\times10^{19}$ to $1\times10^{22}$ atom/cm³ and a depth set to one within a range of 0.1 to 0.5 μm.

11. The diode as claimed in claim 6, wherein said p⁺ type diffusion layer has impurity concentration set to one within a range of $1\times10^{19}$ to $1\times10^{22}$ atom/cm³ and a depth set to one within a range of 0.2 to 1 μm.

* * * * *